(12) United States Patent
Sohn et al.

(10) Patent No.: US 7,817,494 B2
(45) Date of Patent: Oct. 19, 2010

(54) INTEGRATED CIRCUIT MEMORY DEVICES HAVING INTERNAL COMMAND GENERATORS THEREIN THAT SUPPORT EXTENDED COMMAND SETS USING INDEPENDENT AND DEPENDENT COMMANDS

(75) Inventors: Young-soo Sohn, Gyeonggi-do (KR);
Kwang-Il Park, Gyeonggi-do (KR);
Seung-Jun Bae, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 12/236,978

(22) Filed: Sep. 24, 2008

(65) Prior Publication Data

US 2009/0097339 A1  Apr. 16, 2009

(30) Foreign Application Priority Data

Oct. 10, 2007  (KR)  ........................ 10-2007-0102003

(51) Int. Cl.
*G11C 11/00* (2006.01)
(52) U.S. Cl. ............................. 365/233.1; 365/189.05
(58) Field of Classification Search ............. 365/233.1, 365/189.05
See application file for complete search history.

(56) References Cited

U.S. PATENT DOCUMENTS

| | | | | |
|---|---|---|---|---|
| 5,539,696 A | * | 7/1996 | Patel | ..................... 365/189.16 |
| 6,034,916 A | * | 3/2000 | Lee | ........................ 365/233.12 |
| 6,151,239 A | | 11/2000 | Batra | |
| 6,240,495 B1 | * | 5/2001 | Usui | ........................... 711/167 |
| 6,931,479 B2 | * | 8/2005 | Choi | .............................. 711/5 |
| 6,961,830 B2 | * | 11/2005 | Ikeda et al. | ................ 711/154 |

FOREIGN PATENT DOCUMENTS

| | | |
|---|---|---|
| JP | 09-161475 | 6/1997 |
| JP | 2000-268564 | 9/2000 |
| KR | 1020010029985 A | 4/2001 |
| KR | 1020060114524 A | 11/2006 |

* cited by examiner

*Primary Examiner*—Michael T Tran
(74) *Attorney, Agent, or Firm*—Myers Bigel Sibley & Sajovec

(57) ABSTRACT

Integrated circuit memory devices include an internal command generator and a memory control circuit responsive to an internal command generated by the internal command generator. The internal command generator is configured to generate an internal command in response to a combination of an independent command and at least one dependent command received in sequence by the memory device. For example, the internal command generator may be configured to require the independent command to follow the at least one dependent command in the sequence when generating the internal command from the combination of the independent and dependent commands. Alternatively, the internal command generator may be configured to require the independent command to precede the at least one dependent command in the sequence before generating the internal command from the combination of the independent and dependent commands. These independent and dependent commands may be received by the memory device as respective multi-bit external command signals.

11 Claims, 5 Drawing Sheets

INTEGRATED CIRCUIT MEMORY DEVICES HAVING INTERNAL COMMAND GENERATORS THEREIN THAT SUPPORT EXTENDED COMMAND SETS USING INDEPENDENT AND DEPENDENT COMMANDS

REFERENCE TO PRIORITY APPLICATION

This application claims priority from Korean Patent Application No. 10-2007-0102003, filed Oct. 10, 2007, the disclosure of which is hereby incorporated herein by reference.

FIELD OF THE INVENTION

The present invention relates to integrated circuit devices and, more particularly, to integrated circuit memory devices and methods of operating same.

BACKGROUND OF THE INVENTION

Conventional techniques to expand a command set of an integrated circuit memory device, such as dynamic random access memory (DRAM) device, have frequently increased a number of command pins associated with the memory device to support a greater number of commands, which may be issued by a memory controller to the memory device. For example, an expanded command set may utilize six command pins instead of four, including a row-address strobe (RAS) pin, a column address strobe (CAS) pin, a chip select (CS) pin, a write enable (WE) pin, a data mask (DM) pin, which supports data masking, and an on die termination (ODT) pin.

One technique to perform data masking is disclosed in U.S. Pat. No. 6,034,916 to Lee. In particular, FIG. 1 of the '916 patent illustrates how an additional data masking pin (DQM) can be used to support write operation data masking and read operation data masking. Likewise, FIG. 2 of the '916 patent illustrates how two additional data masking pins (DQM_ODD, DQM_EVEN) can be used to support separate odd and even data masking. Alternatively, U.S. Pat. No. 6,151,239 to Batra discloses how an embedded mask value can be communicated within a data packet to identify those data values within the packet that are to be masked during a write operation, without the requirement of an additional pin(s). In particular, the device of Batra exploits the fact that at least one data value within a packet of data will not be transferred to a memory device during a masked write operation, which means the packet space otherwise needed to transfer the omitted data value can instead be used to deliver the mask information. In this manner, the overhead required to transfer the mask information during a write mask operation can be "hidden" in the data transfer itself, thereby conserving bandwidth on a communication channel extending between a memory controller and the memory device.

Notwithstanding these conventional techniques, there continues to be a need for memory devices that utilize more bandwidth efficient techniques to support extended command sets.

SUMMARY OF THE INVENTION

Integrated circuit memory devices according to embodiments of the present invention include an internal command generator and a memory control circuit responsive to an internal command generated by the internal command generator. In particular, these memory devices include an internal command generator that is configured to generate an internal command in response to a combination of an independent command and at least one dependent command received in sequence by the memory device.

According to some of these embodiments of the invention, the internal command generator is configured to require the independent command to follow the at least one dependent command in the sequence when generating the internal command from the combination of the independent and dependent commands. Alternatively, the internal command generator may be configured to require the independent command to precede the at least one dependent command in the sequence before generating the internal command from the combination of the independent and dependent commands. These independent and dependent commands may be received by the memory device as respective multi-bit external command signals.

According to further embodiments of the present invention, a command decoder is provided. This command decoder is configured to decode the external command signals into respective commands within an extended command set, in-sync with a clock signal received by the memory device. This extended command set may include an independent write command and a dependent data mask command, for example. In addition, the internal command generator may be configured to generate an internal write with data mask command (iWDM) in response to receiving a sequence of the independent write command and the dependent data mask command.

In particular, the memory device may be electrically coupled to an address bus and a data bus and the memory control circuit may be configured to mask write data received on the data bus when processing the internal write with data mask command (iWDM). For example, the memory control circuit may be responsive to a data mask address received on the address bus. This data mask address identifies a location of the write data masked by the memory control circuit when processing the internal write with data mask command (iWDM).

According to additional embodiments of the invention, the integrated circuit memory device includes an internal command generator configured to generate an internal command within an extended command set in response to a first combination of an independent command and at least one dependent command received in consecutive sequence by the memory device. The memory control circuit is responsive to the internal command generated by the internal command generator. The internal command generator may also be configured to generate an internal command from a reduced command set in response to a second combination of two independent commands received in consecutive sequence by the memory device. This internal command (from the reduce command set) may correspond directly to the first of the two independent commands in the second combination. Moreover, the internal command generator may be configured to automatically adjust the latency of generating the internal command based on an independent or dependent status of each command received by the memory device.

DETAILED DESCRIPTION OF THE PREFERRED EMBODIMENTS

Figure 1:
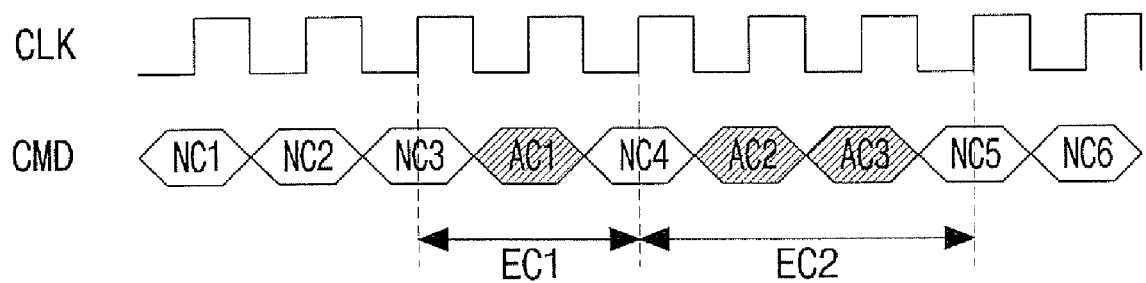
FIG. 1 is a timing diagram that illustrates the sequential timing of normal/independent commands (NC) and auxiliary/dependent (AC) commands received by an integrated circuit memory device, according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Operations to generate internal memory device commands within an extended command (EC) set include receiving a sequence of external commands (CMD), which are synchronized with an external clock signal (CLK). The external commands CMD and external clock signal CLK may be generated by a command processing device, such as an external memory controller, for example. As illustrated by FIG. 1, these external commands include normal commands NCn and auxiliary commands ACn, where "n" is a positive integer. These normal commands and auxiliary commands are also referred to herein as independent commands and dependent commands, respectively. In particular, memory devices according to embodiments of the present invention include an internal command generator that is configured to generate an internal command within an extended command set by evaluating the sequence of external commands received by the memory device. Thus, as illustrated by the timing diagram of FIG. 1, a plurality of commands (NC1, NC2, NC3, AC1, NC4, AC2, AC3, NC5, NC6) may be sequentially provided on an external command bus (eCMD), in-sync with an external clock signal CLK. In particular, FIG. 1 illustrates how a first extended command EC1 may be generated upon detection of a pair of immediately consecutive commands, including a normal command NC3 and an auxiliary command AC1, where the combination NC3+AC1 maps uniquely to EC1 within the internal command generator. As further illustrated by FIG. 1, the first extended command EC1 may be generated in-sync with detection of a normal command NC4 immediately following the auxiliary command AC1, which means the latency associated with generating the first extended command is based on the timing of a command that is received after the commands that define the first extended command. Similarly, a second extended command EC2 may be generated upon detection of a group of three (3) immediately consecutive commands, including a normal command NC4 and a pair of consecutive auxiliary commands AC2 and AC3, where the combination NC4+AC2+AC3 maps uniquely to EC2 within the internal command generator. This second extended command EC2 may be generated in-sync with detection of a normal command NC5 immediately following the auxiliary command AC3.

Figure 2:
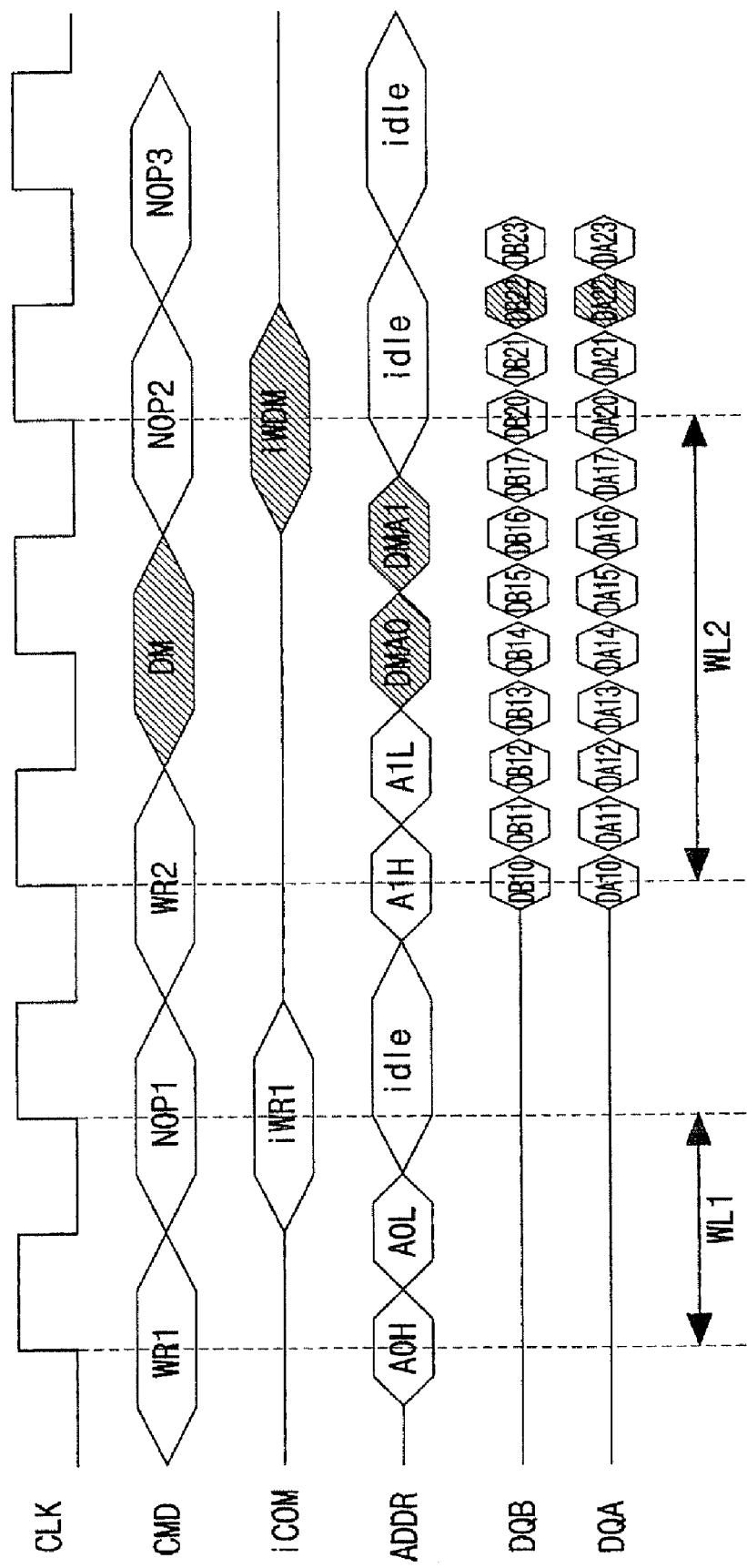
FIG. 2 is a timing diagram that illustrates the timing of internal commands generated by an internal command generator within a memory device, according to embodiments of the present invention.

FIG. 2 illustrates the timing of internal commands (iCOM) that are generated by an internal command generator within an integrated circuit memory device (e.g., DRAM device), in response to a plurality of signals received by the memory device. These internal commands (iCOM) include internal normal commands (iNCOM) and internal extended commands (iECOM). This plurality of signals received by the memory device includes a clock signal (CLK), external command signals (CMD), addresses (ADDR) and data (DQB and DQA), which may be provided on respective signal lines/buses. In particular, the external command signals (CMD), which are received by a memory device in-sync with an external clock signal (CLK), are illustrated sequentially as a first write command WR1, a no-op command (NOP1), a second write command WR2, a data mask command (DM) and a following sequence of a pair of no-op commands (NOP2 and NOP3). The combination of the first write command WR1 and the immediately following no-op command (NOP1), which are both normal/independent commands, results in the generation of an internal write command iWR1 by the internal command generator, which is synchronized with the no-op command (NOP1). The generation of this internal write command iWR1 is illustrated as having a write latency WL1 equivalent to one cycle of the clock signal. In addition, the combination of the second write command WR2 and the immediately following data mask command DM, which is a dependent command, results in the generation of an internal write with data mask command (iWDM) by the internal command generator. The generation of this internal write with data mask command is synchronized with the no-op command NOP2, which follows in time the dependent data mask command. Accordingly, the write latency WL2 associated with the sequential generation of the independent write command WR2 and the subsequent dependent data mask command DM is two clock cycles, which is greater than WL1.

As further illustrated by FIG. 2, an address bus is used for the transmission of high and low bytes of write addresses, which are shown as A0H, A0L and A1H, A1L. The write addresses A0H and A0L are associated with the first write command WR1 and the corresponding write data bytes DA10-DA17, DB10-DB17. The write addresses A1H and A1L are associated with the second write comment WR2 and the corresponding write data bytes DA20-DA27, DB20-DB27. In addition, the corresponding data mask addresses (DMA0, DMA1) associated with the data mask command DM are provided on the address bus. This dependent data mask command DM in combination with the corresponding independent second write command WR2 results in the masking of data DB22 and DA22 on the data bus DQA, DQB, which correspond to the data mask addresses DMA0, DMA1.

Figure 3:
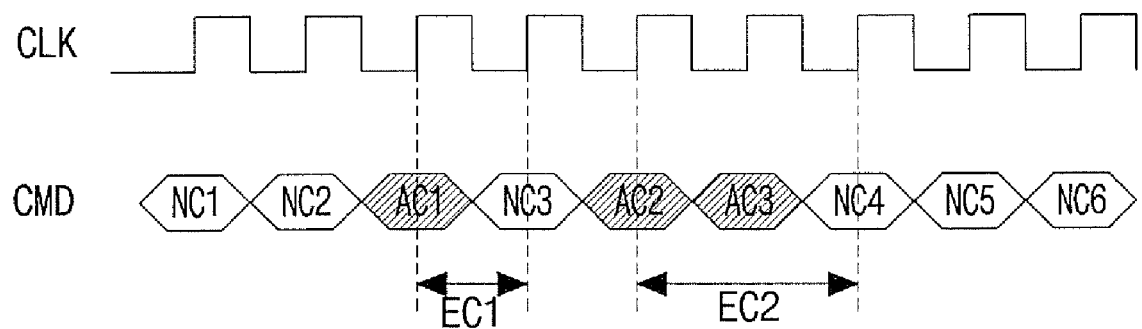
FIG. 3 is a timing diagram that illustrates the sequential timing of normal/independent commands (NC) and auxiliary/dependent (AC) commands received by an integrated circuit memory device, according to alternative embodiments of the present invention.

FIG. 3 is a timing diagram that illustrates how distinct extended commands EC1 and EC2 may be generated from a combination of normal (a/k/a independent) and auxiliary (a/k/a dependent) commands that are synchronized with the generation of a clock signal CLK. The timing diagram of FIG. 3 is similar to the timing diagram of FIG. 1, however, the generation of each extended command is synchronized with a normal command to which the extended command corresponds. Thus, in FIG. 1, the generation of the first extended command EC1 is based on receipt of an auxiliary command AC1 and a normal command NC3 and the timing of the generation of the first extended command EC1 is based on the timing of the receipt of the normal command NC3. Similarly, the generation of the second extended command EC2 is based on receipt of a pair of auxiliary commands AC2 and AC3 followed by a normal command NC4 and the timing of the generation of the second extended command EC2 is based on the timing of receipt of the normal command NC4.

Figure 4:
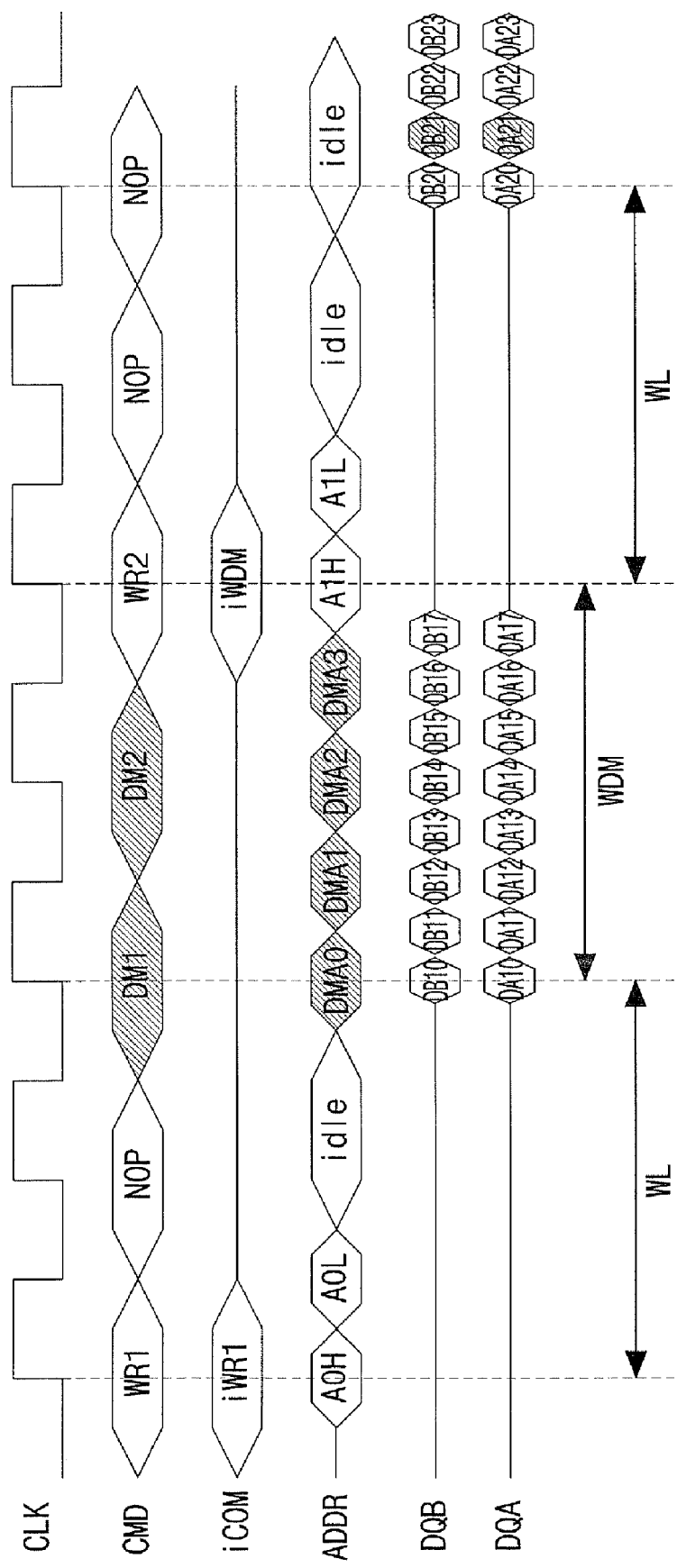
FIG. 4 is a timing diagram that illustrates the timing of internal commands generated by an internal command generator within a memory device, according to alternative embodiments of the present invention.

The generation of the extended commands illustrated by FIG. 3 is further illustrated by the timing diagram of FIG. 4. In particular, FIG. 4 illustrates the receipt of normal and auxiliary commands as command signals (CMD). These normal and auxiliary commands include a first write command (WR1) followed by a no-op command (NOP). The receipt of the first write command WR1 results in the generation of an internal write command iWR1 on an internal command bus iCOM. In addition, a pair of data mask commands (DM1 and DM2) are received in advance of a second write command (WR2). The pair of data mask commands DM1, DM2 and the second write command WR2 result in the generation of an internal write command with data masking (iWDM). As illustrated, this internal write command with data masking (iWDM) is synchronized with the timing of the second write command WR2 and is dependent on the type of dependent command(s) that precedes the independent command.

FIG. 4 further illustrates a write latency of WL associated with the internal write command iWR1, which specifies the delay between the timing of the internal write command iWR1 and the corresponding write data DA10-DA17, DB10-DB17 to be written into memory (not shown) at the address A0H, A0L specified on the address bus ADDR. This write latency of WL is also associated with the internal write with data mask command iWDM. Moreover, the data mask addresses of DMA0, DMA1, DMA2 and DMA3 identify the location of the data to be masked (shown as DA21, DB21) when the data DA20-DA27, DB20-DB27 is written into memory at the address A1H, A1L specified on the address bus ADDR.

Figure 5:
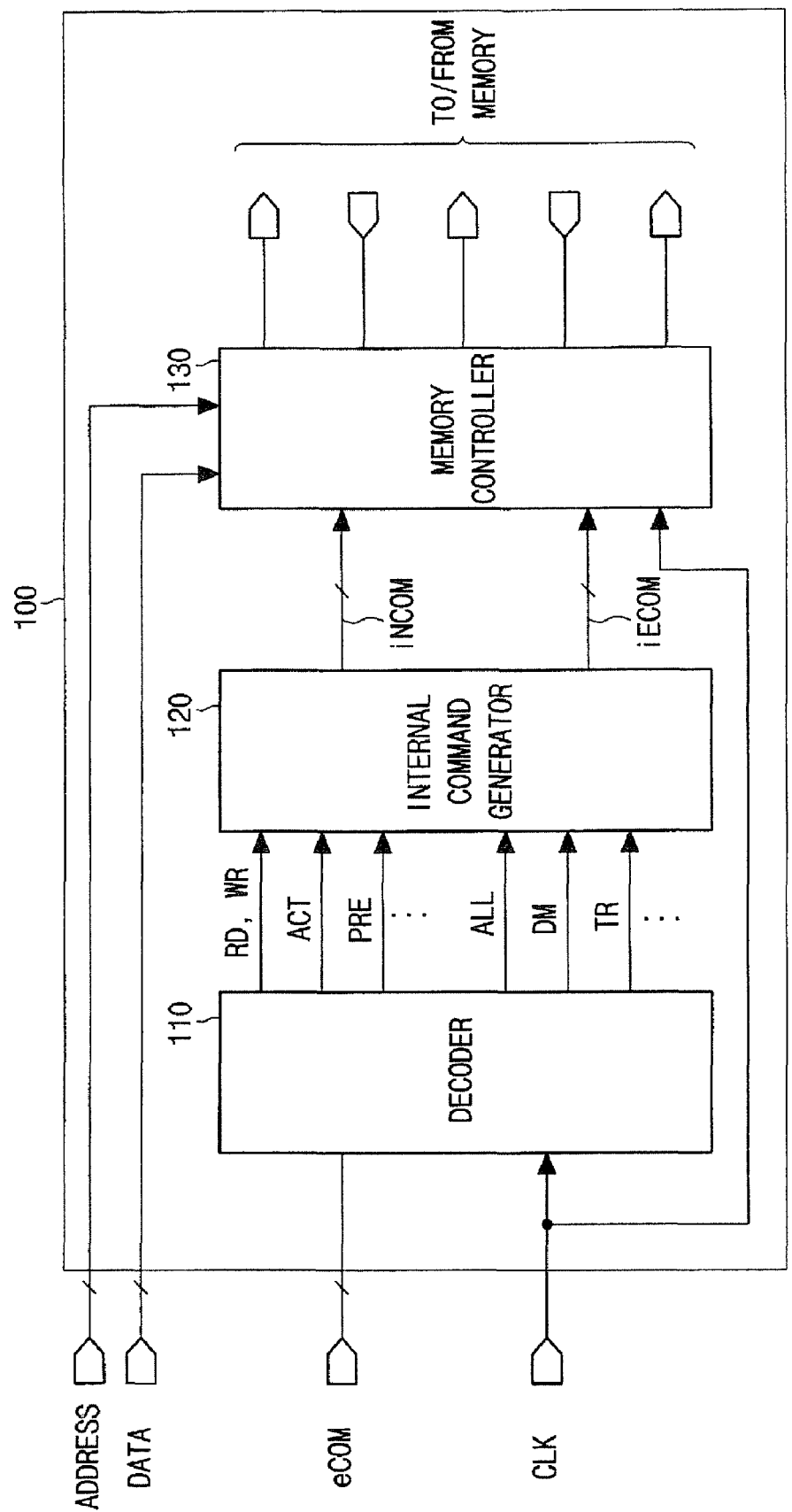
FIG. 5 is a block diagram of an integrated circuit memory device according to embodiments of the present invention.

The operations described above with respect to FIGS. 1-4 may be performed by the integrated circuit memory device 100 illustrated by FIG. 5. This memory device 100 is illustrated as including a command decoder 110, an internal command generator 120 and a memory controller 130. The command decoder 110 is responsive to a clock signal CLK and external command signals provided on an external command bus eCOM. The command decoder 100 is configured to decode the external command signals into respective commands within an extended command set, in-sync with the clock signal CLK. These commands are illustrated as read (RD), write (WR), precharge (PRE), internal all write/read (ALL), data mask (DM) and data training (TR), etc. In response to these independent and dependent commands, the internal command generator 120 generates an internal command in response to a combination of an independent command and at least one dependent command received in sequence by the memory device 100. This internal command may be a normal command provided on bus iNCOM or an extended command provided on bus iECOM. The memory controller 130 is configured to receive the internal commands, data, addresses and the clock signal provided on corresponding buses. In response, the memory controller 130 generates/receives corresponding signals to/from internal memory (not shown) within the memory device 100.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    a command decoder configured to decode external command signals, which are received by the memory device in-sync with a clock signal, into commands within an extended command set;
    an internal command generator configured to generate an internal command in response to a combination of an independent command and at least one dependent command generated as commands within the extended command set by said command decoder; and
    a memory control circuit responsive to the internal command.

2. The memory device of claim 1, wherein said internal command generator is configured to require the independent command to follow the at least one dependent command in the sequence when generating the internal command.

3. The memory device of claim 1, wherein said internal command generator is configured to require the independent command to precede the at least one dependent command in the sequence when generating the internal command.

4. The memory device of claim 1, wherein the external command signals are multi-bit signals.

5. An integrated circuit memory device, comprising:
    an internal command generator configured to generate an internal command in response to a combination of an independent command and at least one dependent command received in sequence by the memory device as respective multi-bit external command signals;
    a memory control circuit responsive to the internal command; and
    a command decoder configured to decode the external command signals into respective commands within an extended command set, in-sync with a clock signal received by the memory device;
    wherein said internal command generator is responsive to the commands within the extended command set.

6. The memory device of claim 5, wherein the extended command set includes an independent write command and a dependent data mask command; and wherein said internal command generator is configured to generate an internal write with data mask command (iWDM) in response to receiving a sequence of an independent write command and a dependent data mask command.

7. The memory device of claim 6, wherein the memory device is electrically coupled to an address bus and a data bus; and wherein said memory control circuit is configured to mask write data received on the data bus when processing the internal write with data mask command (iWDM).

8. The memory device of claim 7, wherein said memory control circuit is responsive to a data mask address received on the address bus; and wherein the data mask address identifies a location of the write data masked by said memory control circuit when processing the internal write with data mask command (iWDM).

9. The memory device of claim 4, wherein the external command signals are selected from a group consisting of a row address strobe signal, a chip select signal, a column address strobe signal and a write enable signal.

10. An integrated circuit memory device, comprising
    an internal command generator configured to generate an internal command from an extended command set in response to a first combination of an independent command and at least one dependent command received in consecutive sequence by the memory device; and
    a memory control circuit responsive to the internal command;

wherein said internal command generator is further configured to generate an internal command from a reduced command set in response to a second combination of two independent commands received in consecutive sequence by the memory device; and wherein the internal command from the reduced command set corresponds directly to the first of the two independent commands in the second combination.

11. The memory device of claim 10, wherein said internal command generator is configured to automatically adjust the latency of generating the internal command based on an independent or dependent status of each command received by the memory device.

* * * * *